(12) United States Patent
Liu et al.

(10) Patent No.: US 11,227,958 B2
(45) Date of Patent: Jan. 18, 2022

(54) CIRCULAR GRATING STRUCTURE FOR PHOTONIC DEVICE

(71) Applicant: Taiwan Semiconductor Manufacturing Co., Ltd., Hsinchu (TW)

(72) Inventors: Tao-Cheng Liu, Hsinchu (TW); Tsai-Hao Hung, Hsinchu (TW); Ying-Hsun Chen, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/863,989

(22) Filed: Apr. 30, 2020

(65) Prior Publication Data
US 2021/0343883 A1    Nov. 4, 2021

(51) Int. Cl.
*H01L 31/18* (2006.01)
*H01L 31/0232* (2014.01)
*H01L 31/0352* (2006.01)
*H01L 31/054* (2014.01)
*H01L 31/02* (2006.01)
*H01L 31/04* (2014.01)

(52) U.S. Cl.
CPC .. *H01L 31/02024* (2013.01); *H01L 31/02327* (2013.01); *H01L 31/054* (2014.12); *H01L 31/18* (2013.01); *H01L 31/0352* (2013.01); *H01L 31/04* (2013.01)

(58) Field of Classification Search
CPC ......... H01L 31/02024; H01L 31/02327; H01L 31/0352; H01L 31/04; H01L 31/054; H01L 31/18
See application file for complete search history.

(56) References Cited

U.S. PATENT DOCUMENTS

| | | | |
|---|---|---|---|
| 9,219,177 B2 | 12/2015 | Fertig et al. | |
| 9,274,283 B1* | 3/2016 | Ellis-Monaghan | ...... G02B 6/34 |
| 9,423,301 B2 | 8/2016 | Savoy et al. | |
| 10,274,678 B1* | 4/2019 | Liu | ...... G02B 5/1819 |

(Continued)

FOREIGN PATENT DOCUMENTS

| | | |
|---|---|---|
| CN | 102881761 A | 1/2013 |
| CN | 103165723 A | 6/2013 |

(Continued)

OTHER PUBLICATIONS

Taillaert, D. et al. "Grating Couplers for Coupling between Optical Fibers and Nanophotonic Waveguides," Japanese Journal of Applied Physics, vol. 45, No. 8A, 2006, pp. 6071-6077. (Year: 2006).*

*Primary Examiner* — Eduardo A Rodela
*Assistant Examiner* — Christopher M Roland
(74) *Attorney, Agent, or Firm* — Seed IP Law Group LLP

(57) ABSTRACT

An integrated circuit includes a photodetector. The photodetector includes a circular optical grating formed in an annular trench in a semiconductor substrate. The circular optical grating includes dielectric fins and photosensitive fins positioned in the annular trench. The circular optical grating is configured to receive incident light and to direct the incident light around the annular trench through the dielectric fins and the photosensitive fins until the light is absorbed by one of the photosensitive fins.

20 Claims, 16 Drawing Sheets

(56) References Cited

U.S. PATENT DOCUMENTS

2012/0170121 A1* 7/2012 Okada ................ G02B 27/4211
359/566
2018/0358488 A1* 12/2018 Yamashita .......... H01L 31/1804
2019/0067343 A1* 2/2019 Chen ................... H01L 27/1461

FOREIGN PATENT DOCUMENTS

| CN | 105210197 A | 12/2015 |
| CN | 109755331 A | 5/2019 |
| TW | 201214719 A1 | 4/2012 |
| WO | 2017/112747 A1 | 6/2017 |

* cited by examiner

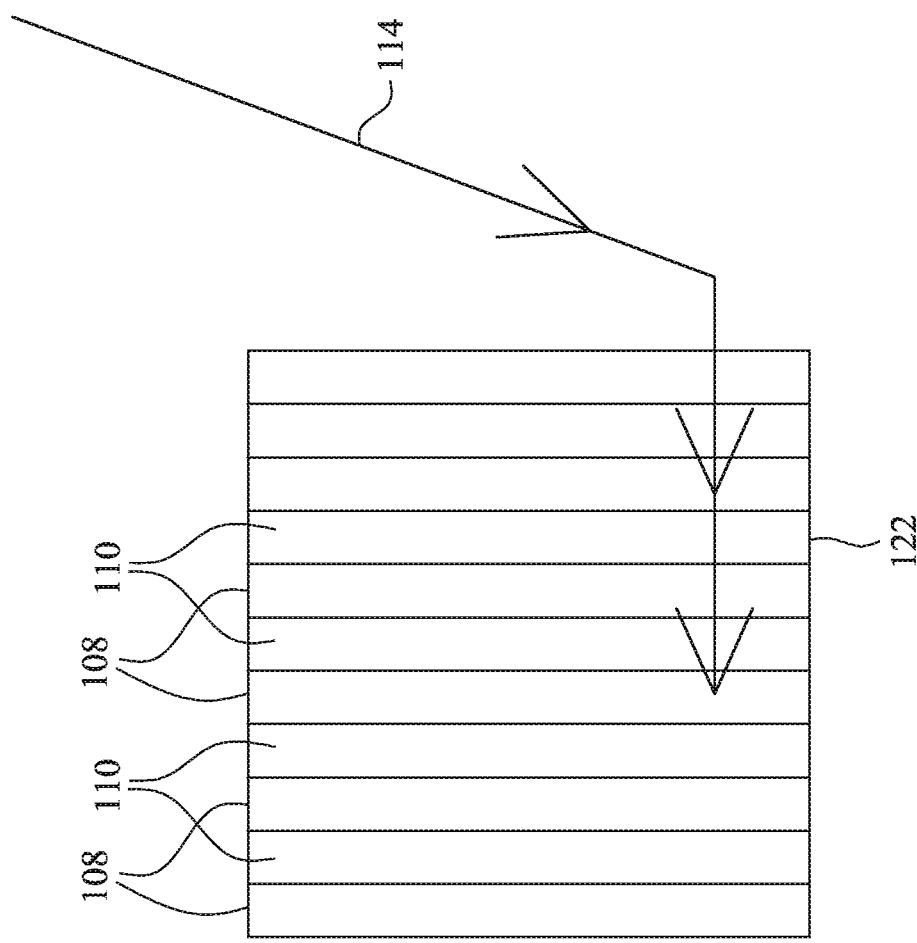

CIRCULAR GRATING STRUCTURE FOR PHOTONIC DEVICE

BACKGROUND

Technical Field

The present disclosure relates to the field of integrated circuit photonics. The present disclosure relates more particularly to photodetectors within integrated circuits.

Description of the Related Art

Many photonic integrated circuits include photodetectors. The photodetectors detect light and generate electrical signals indicative of the light. If the photodetectors do not absorb incident light, then the photodetectors will not generate an electrical signal even though the light is incident on the photodetectors. This represents a lack of sensitivity of the photodetectors.

BRIEF DESCRIPTION OF THE SEVERAL VIEWS OF THE DRAWINGS

FIG. 6C is a cross-sectional diagram of a portion of the integrated circuit of FIG. 6B taken along cross-section line 6C, according to one embodiment.

DETAILED DESCRIPTION

Figure 1:
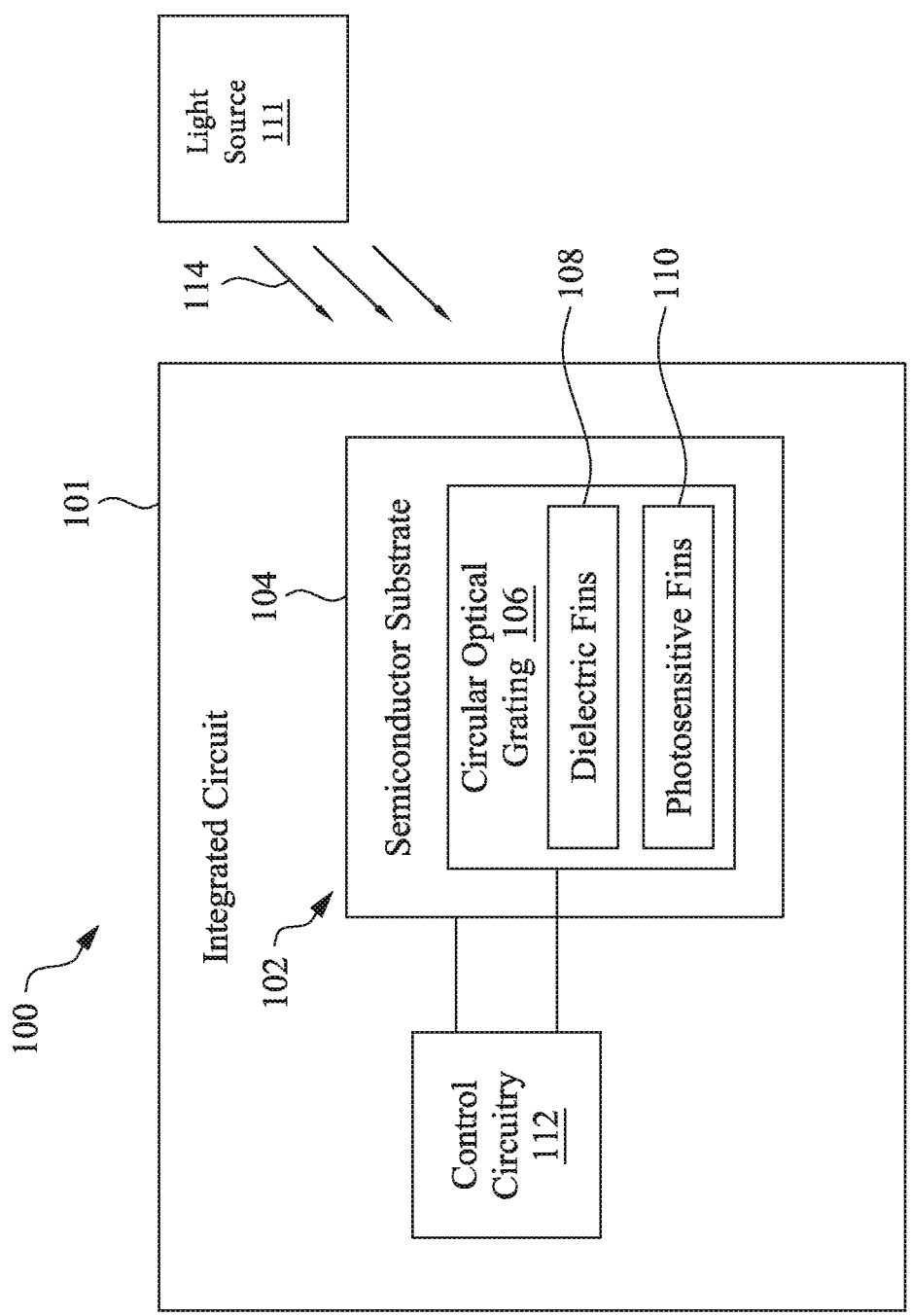
FIG. 1 is a block diagram of an integrated circuit, according to one embodiment.

In the following description, many thicknesses and materials are described for various layers and structures within an integrated circuit. Specific dimensions and materials are given by way of example for various embodiments. Those of skill in the art will recognize, in light of the present disclosure, that other dimensions and materials can be used in many cases without departing from the scope of the present disclosure.

The following disclosure provides many different embodiments, or examples, for implementing different features of the described subject matter. Specific examples of components and arrangements are described below to simplify the present description. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

FIG. 1 is a block diagram of a photonic system, according to one embodiment. The photonic system 100 includes an integrated circuit 101 and a light source 111. The light source 111 outputs light 114. The integrated circuit 101 detects the light 114 and generates signals based on the light 114.

In one embodiment, the integrated circuit 101 includes a photodetector 102 and control circuitry 112. The photodetector 102 includes a semiconductor substrate 104. In the embodiment, a circular photonic grating 106 is formed in the semiconductor substrate 104. The circular photonic grating 106 includes dielectric fins 108 and photosensitive fins 110.

The integrated circuit 101 can include various layers and structures not illustrated in detail in FIG. 1. For example, the integrated circuit 101 can include various layers of semiconductor material, various layers of dielectric material, and various metal interconnect structures. The integrated circuit 101 can include transistors coupled together in complex arrangements.

The photodetector 102 of the integrated circuit 101 is configured to detect light 114 incident on the photodetector 102. For example, light 114 may be incident on the photodetector 102 via various layers of transparent material of the integrated circuit 102. The photodetector 102 detects the light 114.

The control circuitry 112 is coupled to the photodetector 102. The control circuitry 112 can receive signals from the photodetector 102 including electrical signals generated responsive to detecting light. The control circuitry 112 can process the electrical signals and can output data or other signals indicative of one or more parameters of the light 114 detected by the photodetector 102.

In one embodiment, the control circuitry 112 includes a plurality of transistors formed in the integrated circuit 101. The transistors can take part in operating the photodetector 102 and processing the signals received from the photodetector 102. The transistors can also take part in other processes related to function of the integrated circuit 101 including reading data from memory, writing data to memory, processing data, outputting data, and controlling communications.

In one embodiment, the control circuitry 112 can apply voltages to the photodetector 102. The control circuitry 112 can bias the photodetector to ensure that light received by the photodetector 102 will result in the generation of electrical signals that can be read by the control circuitry 112. Accordingly, the control circuitry 112 can be coupled to the photodetector 102 by metal interconnect lines, metal plugs, and conductive contacts by which voltages can be applied to the photodetector 102 and signals can be received from the photodetector 102.

In one embodiment, the photodetector 102 operates by absorbing light 114. More particularly, the light 114 is made up of photons that can be absorbed by the photodetector 102. When the photodetector 102 absorbs photons, an electrical signal is generated responsive to the absorption of the photons. Accordingly, characteristics of the light 114, or merely the presence of the light 114, are indicated by the electrical signals generated by the photodetector 102 responsive to absorbing photons.

When light travels through a first material and is incident on a boundary between the first material and a second material, the light may be reflected at the boundary or may be transmitted through the boundary into the second material. The reflection or transmission of light at a boundary between two materials is based on the characteristics of the two materials and the characteristics of the light. The relevant characteristics of the two materials can include their transmission and reflection coefficients. The relevant characteristics of the light can include the wavelength of the light and the angle at which the light is incident on the boundary.

As light travels through a material, some of the light may be absorbed by the material. The amount of light that will be absorbed by the material is based, in part, on the absorption coefficient of the material and on the length of the path light takes through the material. A higher coefficient of absorption results in a higher rate of absorption. Likewise, a longer path of travel through a material results in a higher rate of absorption in the material. Additionally, the coefficient of absorption for a material varies with the wavelength of light. A material may absorb some wavelengths of light more readily than other wavelengths of light.

An individual photon passing through a material has a probability of being absorbed by the material. The probability of absorption depends on the wavelength of the photon, the absorption coefficient of the material for that wavelength, and the length of the path that the photon travels through the material. All these factors are relevant in the way the photodetector 102 detects light.

The photodetector 102 utilizes the photosensitive fins 110 to absorb, and thereby detect, light. The photosensitive fins 110 are made of a photosensitive material. The photosensitive material is a material that has a relatively high absorption coefficient for a selected range of wavelengths of light. The selected range may correspond to a particular color of visible light. The selected range may correspond to a range of wavelengths associated with optical communication. Visible light and light having wavelengths associated with optical communications are examples of light that photodetectors in accordance with embodiments disclosed herein can detect. Embodiments of the present disclosure are not limited to photodetectors that detect visible light or light having wavelengths associated with optical communications. Embodiments in accordance with the present disclosure include photodetectors capable of detecting light other than visible light or light having wavelengths associated with optical communications.

The integrated circuit 101 is configured to allow light 114 to pass through various layers to the circular optical grating 106 without being absorbed or reflected prior to reaching the circular optical grating 106. Accordingly, the integrated circuit 101 can include multiple transparent layers having low coefficients of absorption and reflection, thereby enabling light 114 to pass through these transparent layers of the integrated circuit 101 to the circular photonic grating.

In one embodiment, the circular photonic grating 106 includes an annular trench formed in the semiconductor substrate 104. The dielectric fins 108 and the photosensitive fins 110 each extend between an inner wall of the trench and an outer wall of the trench. The dielectric fins 108 and the photosensitive fins 110 are positioned in alternating order such that each photosensitive fin 110 is positioned between two dielectric fins 108. Correspondingly, each dielectric fin 108 is positioned between two photosensitive fins 110.

The photodetector 102 utilizes the circular photonic grating 106 to enhance the sensitivity of the photodetector 102. The circular photonic grating enhances the sensitivity of the photodetector by 102 by increasing the length of the path taken by individual photons through the photosensitive material. In particular, the circular optical grating 106 is configured to receive incident light at a selected angle relative to vertical, to redirect the light from the selected angle to a substantially horizontal angle, and then to cause the light 114 to travel around the circular optical grating until it is absorbed by one of the photosensitive fins 110. Accordingly, the circular optical grating 106 is configured to cause the light 114 to travel around the circular optical grating 106 indefinitely.

The larger the number of times that an individual photon passes through one of the photosensitive fins 110, the larger the likelihood that the photon will be absorbed by one of the photosensitive fins. The circular optical grating 106 causes light to travel in a substantially circular path indefinitely through the circular optical grating 106. As the light travels around the circular optical grating 106, the light will continuously encounter photosensitive fins 110. Thus, the circular optical grating 106 effectively increases a length of travel of the photons through the photosensitive material. The longer path within the photosensitive material results in a higher likelihood that the photon will be absorbed by the photosensitive material. Accordingly, a longer path within the photosensitive material results in an effective increase in the sensitivity of the photodetector 102.

In one embodiment, the circular optical grating 106 helps to direct the photons to stay within the circular optical grating 106 until absorption by implementing a lensing effect within the circular optical grating 106. In particular, the dielectric fins 108 and the photosensitive fins 110 are formed as lenses in the circular optical grating. As each fin extends between the inner sidewall wall and the outer sidewall of the trench, each fin has a selected curvature. The curvature of the fins has a lensing effect. The cumulative lensing effect of the fins directs light to follow a circular path through the trench. The result of this lensing effect is that light tends to travel in a circle indefinitely until it is eventually absorbed by one of the photosensitive fins 110.

In one embodiment, the circular optical grating 106 helps to confine light within the circular optical grating 106 based on the principle of total internal reflection. Total internal reflection occurs when light traveling through a first material having a first index of refraction $n_1$ encounters a boundary between the first material and a second material having a second index of refraction $n_2$ that is lower than the index of refraction $n_1$ of first material. If the angle of incidence of the light on the boundary is greater than a critical angle $\theta_c$, then total internal reflection will occur and the light will be reflected at the boundary rather than being transmitted through the boundary into the second material. The value of the critical angle $\theta_c$ is given by the following relationship:

$$\theta_c = \arcsin(n_2/n_1),$$

where $n_2 < n_1$. The inner and outer sidewalls of the trench are covered in the dielectric material. The the photosensitive material of the photosensitive fins 110 and the dielectric material are selected such that the photosensitive material has a higher index of refraction then the index of refraction of the dielectric material. Thus, when light is incident on the boundary between the dielectric material and the photosensitive fins 110 at either the inner or outer sidewall of the trench, total internal reflection can occur and the light can continue within the circular optical grating 106.

In one embodiment, the photodetector 102 includes a photodiode. The photodiode includes multiple regions of semiconductor material. For example, the photosensitive material of the photosensitive fins 110 can include a monocrystalline semiconductor material doped with a first dopant type, either P-type or N-type. The semiconductor substrate 104 can include a monocrystalline semiconductor material doped with a second dopant type that is the complement of the first dopant type. The photosensitive material 106 and the semiconductor substrate 104 form a P-N junction. When a photon is absorbed by the photosensitive material of one of the photosensitive fins, an electron receives an energy corresponding to the wavelength of the photon and moves from the valence band into the conduction band. The control circuitry 112 biases the photosensitive fins 110 and the semiconductor substrate 104 such that the electron in the conduction band flows as an electrical current detected by the control circuitry 112. Accordingly, the control circuitry 112 detects the brightness or intensity of the light 114 as an electrical current formed by electrons that transition from the valence band to the conduction band by the absorption of light. The photodiode can include other configurations of P and N semiconductor regions than those described above without departing from the scope of the present disclosure. Additionally, the photodiode can include P and N regions separated by intrinsic semiconductor regions. The intrinsic semiconductor regions can correspond to semiconductor reasons that are substantially free of dopants.

In one embodiment, the photodetector 102 can be a photodetector other than a photodiode. Many possible configurations of a photodetector are possible utilizing absorption of light by photosensitive fins 110. The principles of utilizing the circular optical grating 106 to increase the path length of light within the photosensitive fins 110 as described herein can be implemented in these other types of photodetectors without departing from the scope of the present disclosure.

In one embodiment, the photosensitive material of the photosensitive fins 110 includes germanium, the dielectric material of the dielectric fins 108 includes silicon dioxide, and the dielectric material covering the sidewalls of the trench includes silicon dioxide. Germanium has a relatively high absorption coefficient for wavelengths of light between 400 nm and 1700 nm. Additionally, germanium has a relatively high index of refraction of 4. Silicon dioxide has an index of refraction of 1.46. This combination of materials results in a critical angle of:

$$\theta_c = \arcsin(1.46/4) = 21.4°.$$

Accordingly, any angle of incidence of light greater than 21.4° between the photosensitive material and the dielectric material covering the sidewalls will result in total internal reflection.

The photosensitive material can include materials other than germanium. For example, the photosensitive material can include silicon, silicon germanium, indium gallium arsenide, lead sulfide, mercury cadmium telluride, or other photosensitive materials. Those of skill in the art will recognize, in light of the present disclosure, that the photosensitive material can include materials other than those described above without departing from the scope of the present disclosure. The photosensitive material can include one or more P doped regions. The photosensitive material can include one or more N doped regions. The photosensitive material may include both P doped regions and N doped regions The dielectric fins 108 can include materials other than silicon dioxide. For example, the dielectric fins 108 can include silicon nitride, carbon doped silicon oxide, or other dielectric materials. Many kinds of dielectric materials can be utilized for the dielectric fins 108 without departing from the scope of the present disclosure.

The layer of dielectric material covering the sidewalls of the trench can include materials other than silicon dioxide. For example, the dielectric material can include silicon nitride, carbon doped silicon oxide, or other dielectric materials. Many kinds of dielectric materials can be utilized to cover the sidewalls of the trench without departing from the scope of the present disclosure.

The semiconductor substrate 104 may include one or more layers of semiconductor material including silicon, germanium, silicon germanium, silicon carbide, gallium arsenide, indium arsenide, indium phosphide, silicon germanium carbide, gallium arsenide phosphide, or gallium indium phosphide. Other semiconductors can be used for the semiconductor substrate 104 without departing from the scope of the present disclosure.

The integrated circuit 101 may be bonded to a second integrated circuit. The integrated circuit 101 may pass electronic signals generated by the photodetector 102 to circuitry included in the second integrated circuit. The second integrated circuit may include processing circuitry to process the electrical signals.

Figure 2:
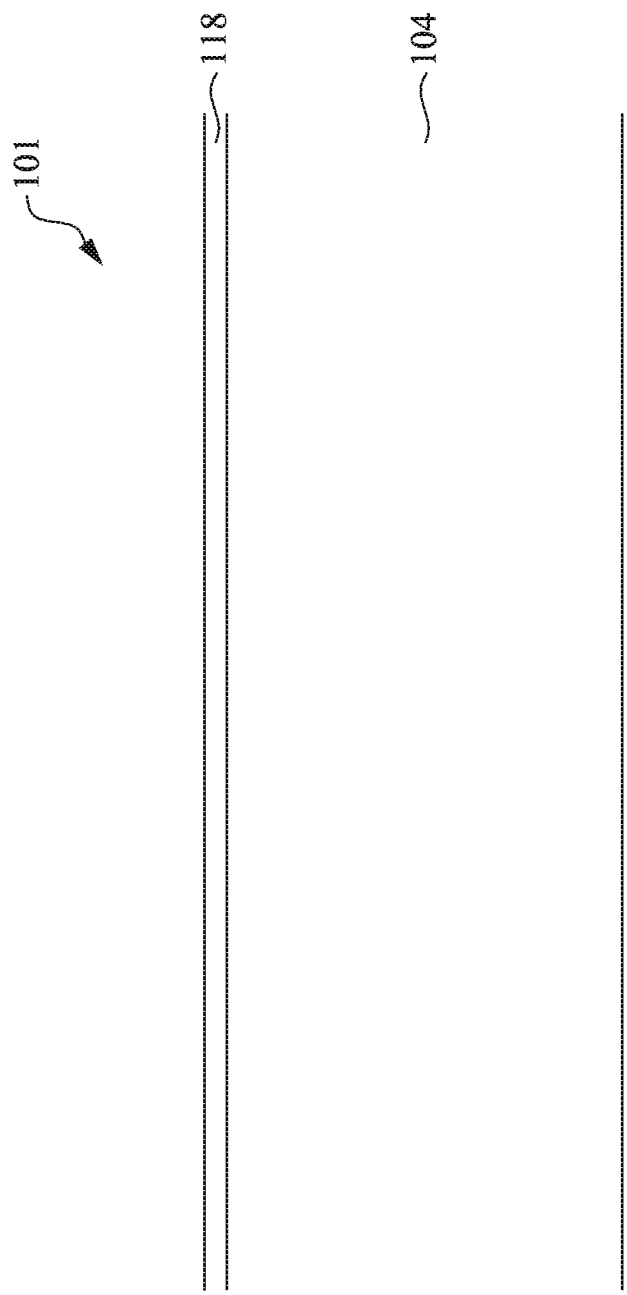
FIG. 2 is a cross-sectional diagram of an integrated circuit at an intermediate stage of fabrication, according to one embodiment.

FIG. 2 is a cross-sectional view of a portion of an integrated circuit 101 at an intermediate stage of processing, according to one embodiment. In particular, the view of FIG. 2 illustrates a portion of a process for forming a photodetector 102 within the integrated circuit 101. At the stage shown in FIG. 2, the illustrated portion of the integrated circuit 101 includes a semiconductor substrate 104 and a layer of dielectric material 118.

The semiconductor substrate 104 may include one or more layers of semiconductor material. The semiconductor material can include silicon, germanium, silicon germanium, silicon carbide, gallium arsenide, indium arsenide, indium phosphide, silicon germanium carbide, gallium arsenide phosphide, or gallium indium phosphide. Other semiconductor materials can be used for the semiconductor substrate 104 without departing from the scope of the present disclosure. The semiconductor substrate 104 can include a monocrystalline semiconductor material or multiple layers of monocrystalline semiconductor material.

In one embodiment, the layer of dielectric material 118 can include silicon nitride, silicon oxide, or another dielectric material. The layer of dielectric material 118 is between 1 µm and 100 µm in thickness. The layer of dielectric material 118 can be deposited by one or more thin-film deposition processes including chemical vapor deposition, physical vapor deposition, plasma enhanced chemical vapor deposition, atomic layer deposition, or other types of deposition processes. The layer of dielectric material 118 can include other materials, thicknesses, and deposition processes than those described above, without departing from the scope of the present disclosure.

Figure 3A:
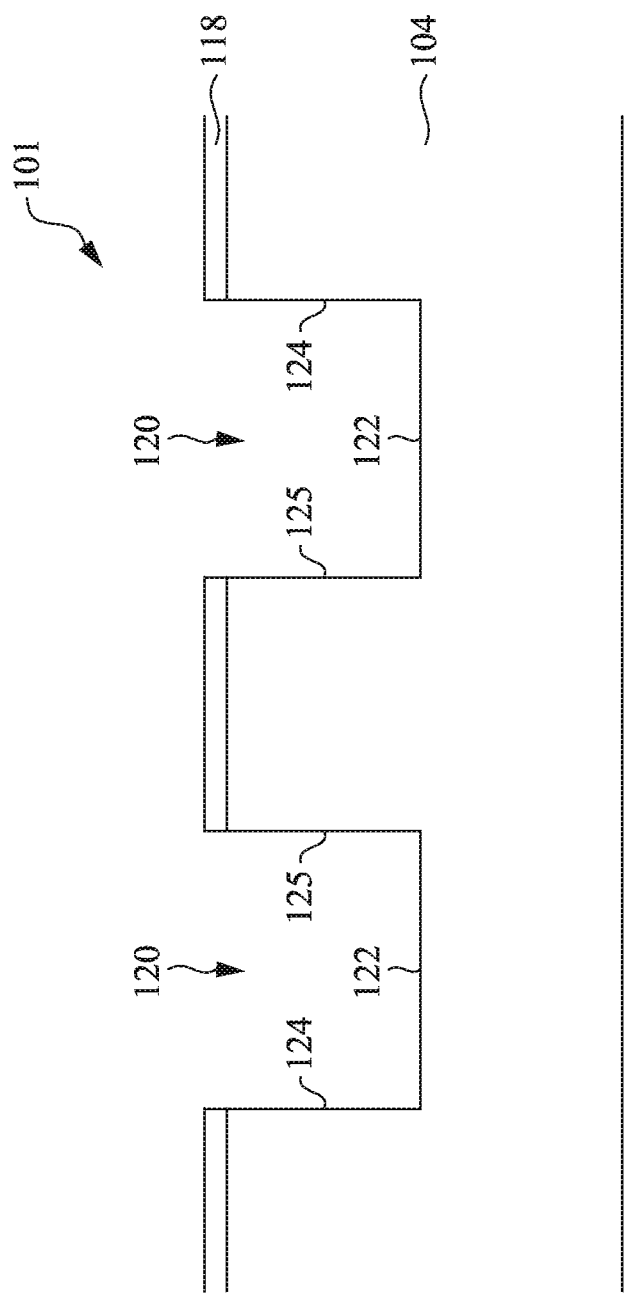
FIG. 3A is a cross-sectional diagram of an integrated circuit at an intermediate stage of fabrication, according to one embodiment.

FIG. 3A is a cross-sectional view of a portion of the integrated circuit 101 at an intermediate stage of processing, according to one embodiment. In FIG. 3A a trench 120 has been opened in the semiconductor substrate 104. The trench 120 defines a bottom surface 122, an outer sidewall 124, and an inner sidewall 125. In some embodiments, the trench 120 can have a depth of up to 700 µm. In some embodiments, the trench 120 can have a width of up to 700 µm. The trench 120 can have other depth and width dimensions than those described above without departing from the scope of the present disclosure.

The trench 120 is an annular or circular trench with a substantially rectangular cross section. The trench 120 makes a complete circle in the semiconductor substrate 104. This is more clearly illustrated in the top view of FIG. 3B. The radius of the outer sidewall of the trench is between 100 µm and 2 mm. The radius of the inter sidewall 125 is between 10 µm and 1 mm. Other dimensions can be utilized for the trench 120 without departing from the scope of the present disclosure. One purpose of the annular trench 120 is to form an optical grating that causes light 114 to travel around the annular trench until absorption by a photosensitive material. Accordingly, the dimensions of the trench can be selected based on the expected wavelength of incident light 114 and the lensing effects of dielectric fins and photosensitive fins, as will be described in more detail below.

In one embodiment, the trench 120 is formed by utilizing photolithography techniques. The photolithography techniques can include depositing photoresist on the layer of dielectric material 118, exposing the photoresist to light via a photolithography mask, and removing portions of the photoresist in accordance with an annular pattern defined by the mask.

After the photoresist has been patterned, the integrated circuit 101 is exposed to an etching process. The etching process first etches exposed portions of the layer of dielectric material 118. The layer of dielectric material 118 can be etched using one or more wet etches, dry etches, or other types etching processes. The semiconductor substrate 104 can be etched during the same etching process that etches the layer of dielectric material 118. Alternatively, the semiconductor substrate 104 can be etched using a separate etching process after the exposed portion of the layer of dielectric material 118 has been etched.

After the one or more etching processes have been performed on the exposed portions of the layer of dielectric material 118 and the semiconductor substrate 104, the trench 120 has been formed. The trench 120 includes the outer sidewall 124, the inner sidewall 125, and the bottom surface 122.

Figure 3B:
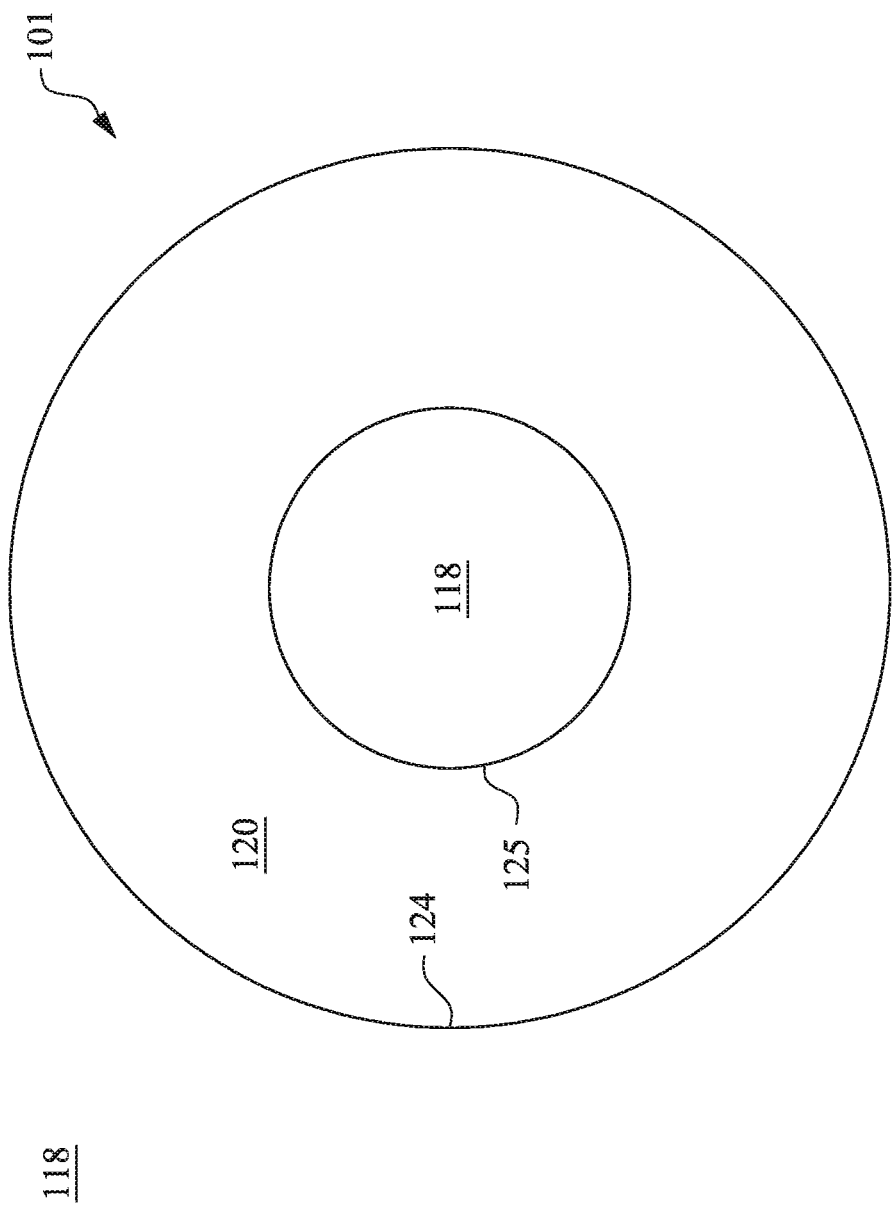
FIG. 3B is a top view of the integrated circuit of FIG. 3A, according to one embodiment.

FIG. 3B is a top view of the integrated circuit 101 of FIG. 3A, according to one embodiment. The trench 120 has an annular or circular shape. The layer of dielectric material 118 covers the surface of the semiconductor substrate 104 outside of the trench 120.

Figure 4:
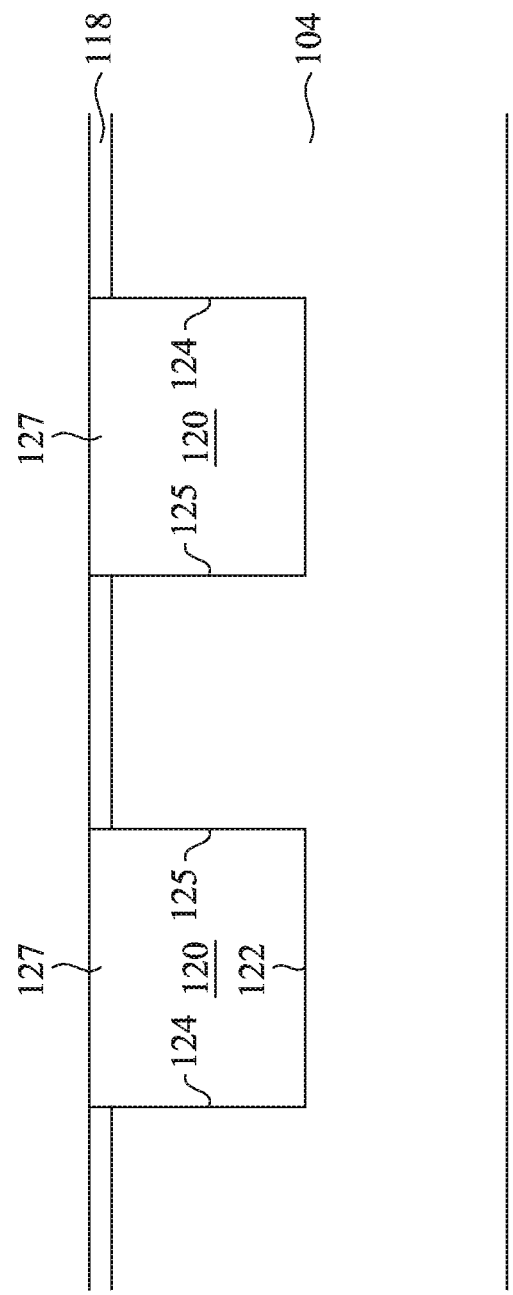
FIG. 4 is a cross-sectional diagram of an integrated circuit at an intermediate stage of fabrication, according to one embodiment.

FIG. 4 is a cross-sectional view of a portion of the integrated circuit 101 at an intermediate stage of processing, according to one embodiment. In FIG. 4 a layer of dielectric material 127 has been deposited on the layer of dielectric material 118 and on the semiconductor substrate 104 in the trench 120. The layer of dielectric material has been subject to a planarization process that removes the dielectric material 127 from the top of the layer of dielectric material 118. The layer of dielectric material 127 can include silicon dioxide, silicon nitride, or another dielectric material. The layer of dielectric material 127 can be deposited by a thin film deposition process including one or more of chemical vapor deposition, physical vapor deposition, plasma enhanced chemical vapor deposition, atomic layer deposition, or other thin-film deposition techniques. Other dielectric materials and deposition processes can be utilized for the layer of dielectric material 127 than those described above without departing from the scope of the present disclosure.

Figure 5A:
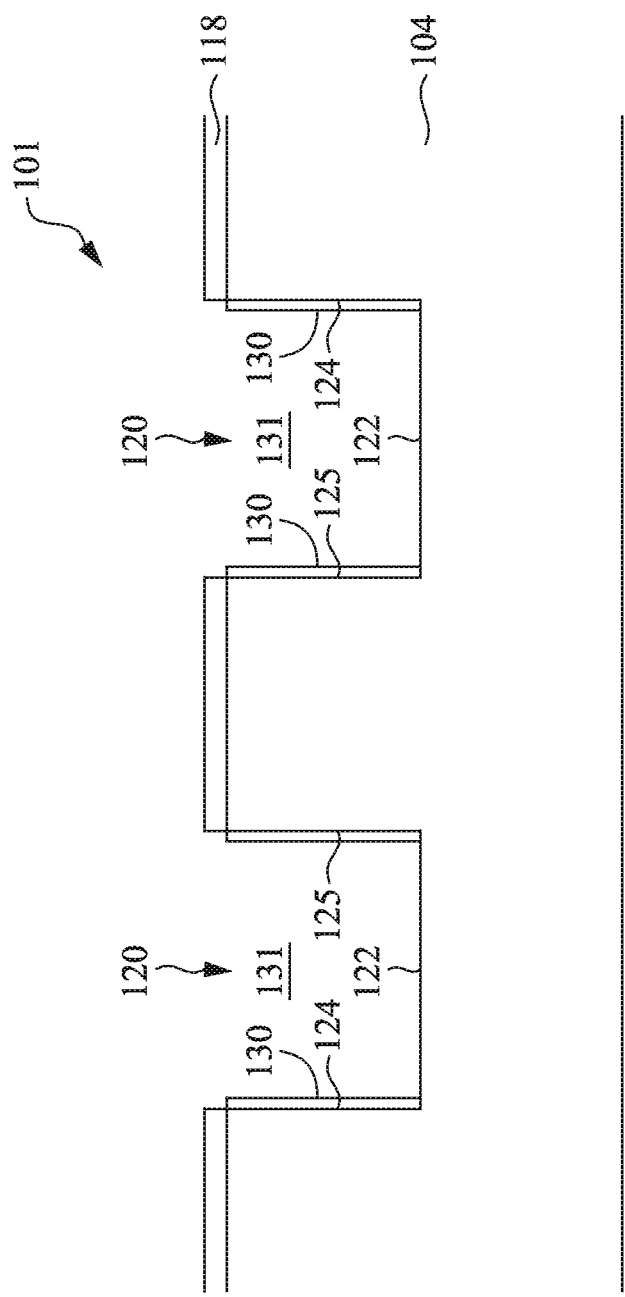
FIG. 5A is a cross-sectional diagram of an integrated circuit at an intermediate stage of fabrication, according to one embodiment.
Figure 5B:
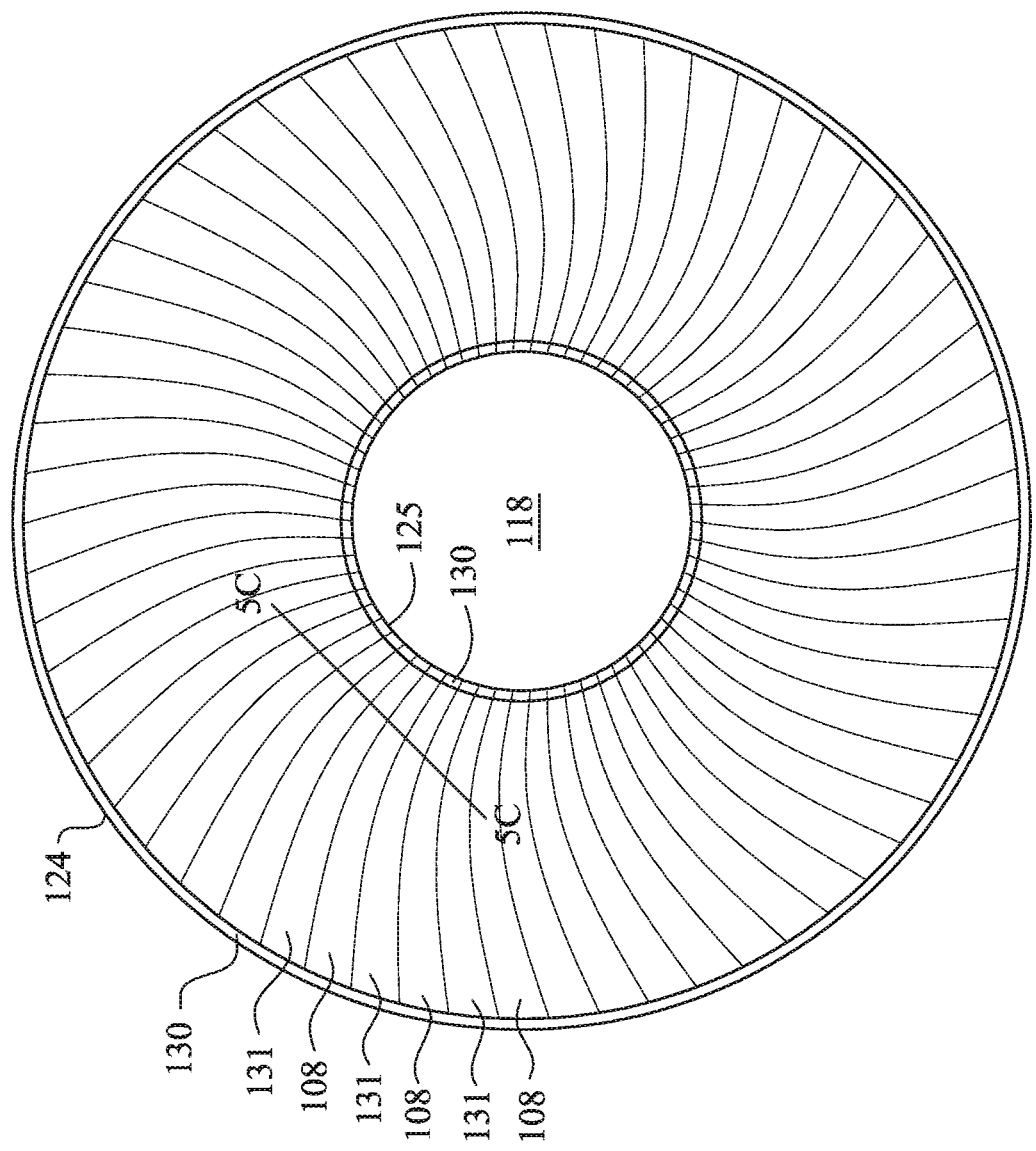
FIG. 5B is a top view of the integrated circuit of FIG. 5A, according to one embodiment.

FIG. 5A is a cross-sectional view of a portion of the integrated circuit 101 at an intermediate stage of processing, according to one embodiment. FIG. 5B is a top view of the integrated circuit 101 of FIG. 5A. In FIGS. 5A and 5B, the layer of dielectric material 127 has been patterned and etched, leaving a dielectric sidewall coating 130 on the outer sidewall 124 and the inner sidewall 125 of the trench 120 after the one or more etching processes. The etching process also leaves a plurality of dielectric fins 108 (see FIGS. 5B and 5C) extending from the bottom surface 122 of the trench 120. The dielectric sidewall coating 130 and the dielectric fins 108 are remnants of the layer of dielectric material 127.

The dielectric fins 108 and the dielectric sidewall coating 130 can be formed, in part, by utilizing photolithography techniques. For example, the photolithography techniques can include depositing photoresist on the layer of dielectric material 127, exposing the photoresist to light via a photolithography mask, and removing portions of the photoresist in accordance with the pattern defined by the mask.

After the photoresist has been patterned, the exposed portions of the layer of dielectric material 127 are subjected to an anisotropic etching process. The anisotropic etching process selectively etches in the downward direction. This means that the anisotropic etching process etches the layer of dielectric material 127 in the downward direction but not in other directions. More particularly, the anisotropic etch etches the layer of dielectric material much more rapidly in the downward direction than in other directions.

In one embodiment, the dielectric fins 108 have a curved shape, as seen in the top view of FIG. 5B. In particular, the dielectric fins 108 are curved in the shape of a lens. The curved lens shapes of the dielectric fins 108 is selected to continually focus incident light 114 into a circular path around the annular trench 120.

The etching process also defines gaps 131 between the dielectric fins 108. The gaps 131 have the curved shape of a lens. Each pair of dielectric fins 108 are separated by a gap 131.

The cross-sectional view of FIG. 5A passes through gaps 131 in the trench 120. However, in practice, a straight cross-sectional line through the center of the annular trench 120 would pass through portions of both dielectric fins 108 and gaps 131 due to the curved shape of the dielectric fins 108 and the gaps 131. For simplicity, FIG. 5A shows a cross-section as though taken on a line that passes only through gaps 131 on either side of the annular trench 120.

Figure 5C:
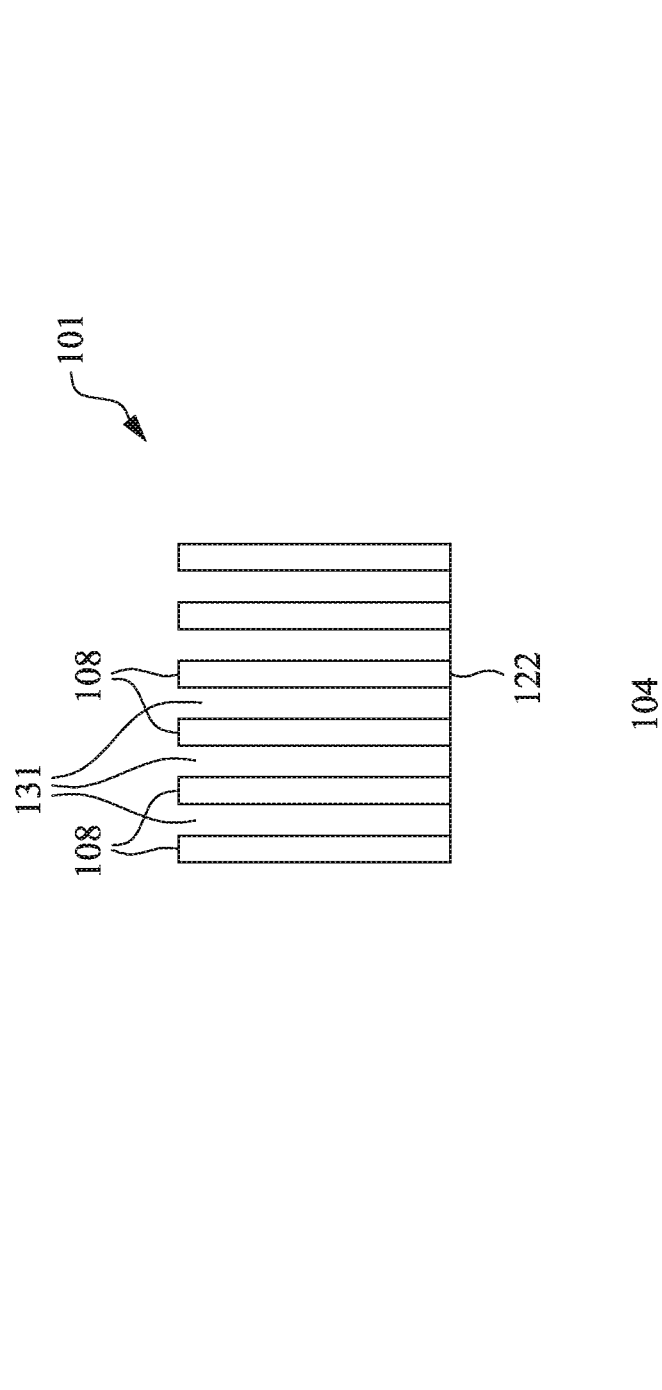
FIG. 5C is a cross-sectional diagram of a portion of the integrated circuit of FIG. 5B taken along cross-section line 5C, according to one embodiment.

FIG. 5C is a cross-sectional view through a portion of the trench 120 along the line 5C shown in FIG. 5A, according to one embodiment. The line 5C passes through multiple dielectric fins 108 and gaps 131 between the fins 131.

In one embodiment, the dielectric fins 108 each have a width between 1 nm and 100 nm. The gaps 131 can have the same width as the dielectric fins 108. Alternatively, the gaps 131 and the dielectric fins 108 can have different widths.

Figure 6A:
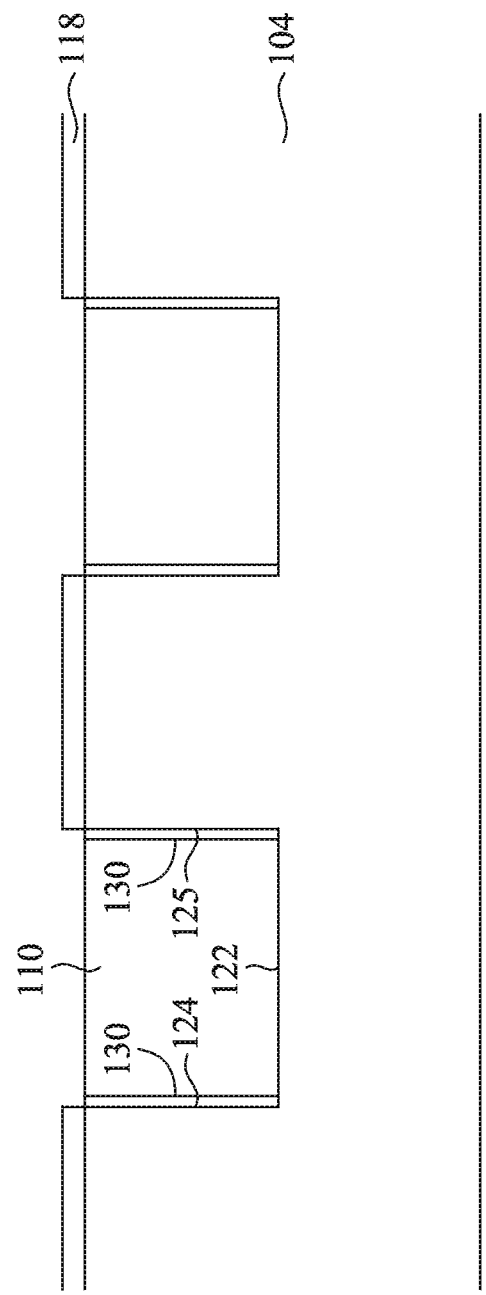
FIG. 6A is a cross-sectional diagram of an integrated circuit at an intermediate stage of fabrication, according to one embodiment.
Figure 6B:
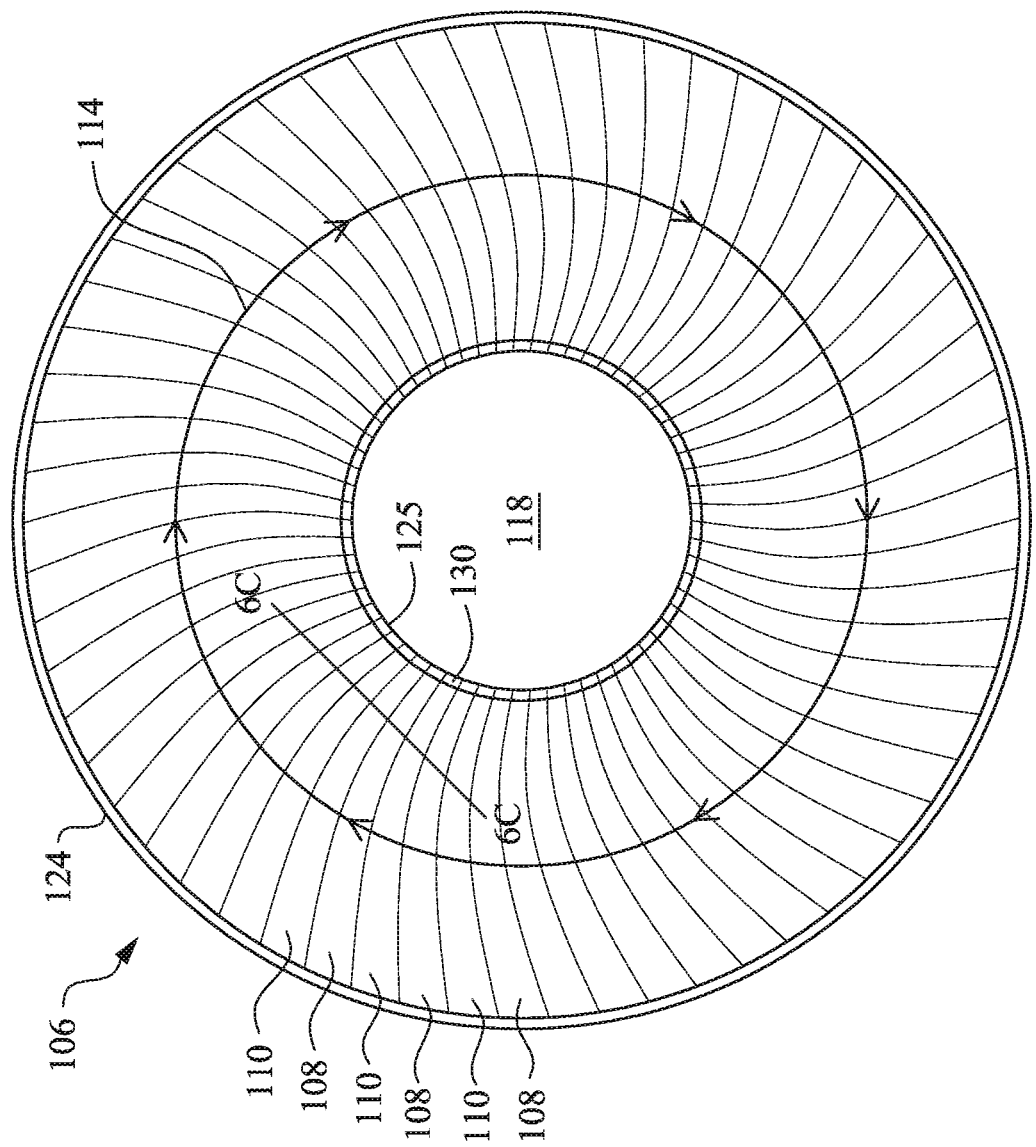
FIG. 6B is a top view of the integrated circuit of FIG. 6A, according to one embodiment.

FIG. 6A is a cross-sectional diagram of the integrated circuit 101 at an intermediate stage of processing, according to one embodiment. FIG. 6B is a top view of the integrated circuit 101 of FIG. 6A, according to one embodiment. In FIGS. 6A and 6B, photosensitive fins 110 have been formed in the trench 120 in the gaps 131 between the dielectric fins 108. A planarization process can be performed to make the heights of the dielectric fins and the photosensitive fins 110 uniform.

The photosensitive fins 110 are curved and have a shape of a lens, as seen in the top view of FIG. 6B. The lens shapes of the photosensitive fins 110 and the dielectric fins 108 are selected to cause light 114 to travel in a circular path around the annular trench 120. The photosensitive fins 110 have widths corresponding to the widths of the gaps 131 between the dielectric fins 108, as described previously in relation to FIGS. 5A-5C.

As described previously in relation to FIG. 1, the photosensitive material is a material with a relatively high absorption coefficient for a selected range of wavelengths of light. Additionally, the photosensitive material 106 is a material with a relatively high index of refraction in comparison to the dielectric material of the dielectric fins 108 and the dielectric sidewall coating 130.

In one embodiment, the photosensitive material of the photosensitive fins 110 includes one or more of germanium, silicon, silicon germanium, indium gallium arsenide, lead sulfide, mercury cadmium telluride, or other photosensitive materials. Those of skill in the art will recognize, in light of the present disclosure, that the photosensitive material can include materials other than those described above without departing from the scope of the present disclosure.

In one embodiment, the photosensitive fins 110 collectively form a photodiode in conjunction with the semiconductor substrate 104. Accordingly, the photosensitive material of the photosensitive fins 110 can include a monocrystalline semiconductor structure. The photosensitive fins 110 can each include one or more doped regions for functioning as a photodiode. The photosensitive fins 110 can each include one or more P doped regions. The photosensitive fins 110 can each include one or more N doped regions. The photosensitive fins 110 may each include both P doped regions and N doped regions In one embodiment, the photosensitive fins are deposited in the trench 120 via an epitaxial growth. The photosensitive fins 110 can be grown epitaxially from the semiconductor substrate 104. In particular, the photosensitive fins 110 can be grown epitaxially from the bottom surface 122 of the annular trench 120. The crystalline structure of the semiconductor substrate 104 acts as a seed to grow the crystalline structure of the photosensitive fins 110.

The epitaxial growth can occur in one or more stages. If the photosensitive fins 110 are to be doped, then the doping can occur in situ during the epitaxial growth of the photosensitive fins 110. If the photosensitive fins 110 are to include multiple differently doped regions, then the doping can occur in situ during successive stages of the epitaxial growth process. The photosensitive fins 110 can each include intrinsic regions with comparatively little doping, or no doping. The doping profiles and the types of doping or lack doping in various regions is selected in accordance with the design of the photodetector 102 in conjunction with the semiconductor substrate 104.

The annular trench 120, the photosensitive fins 110, and the dielectric fins 108 collectively form a circular optical grating 106. The circular optical grating 106 is configured to redirect light 114 incident at an angle between 45° and 90° relative to vertical, to travel substantially in a horizontal direction through the circular optical grating 106. In one example embodiment, light 114 is incident on the circular optical grating 106 from a light source 111, such as a fiberoptic cable, at an angle between 45° and 90° relative to vertical. The circular optical grating 106 redirects the light to a substantially horizontal trajectory within the circular optical grating 106, as indicated by the path of the light 114 in FIG. 6C. The lensing effects of the lens shaped dielectric fins 108 and photosensitive fins 110 cause the now substantially horizontal light to travel in a circle around the trench 120 until the light 114 is absorbed by one of the photosensitive fins 110. The circular path of the light 114 is illustrated in FIG. 6B. Because the light travels in loops through the circular optical grating 106, the light is highly likely to eventually be absorbed by one of the photosensitive fins 110, thereby enhancing the sensitivity of a photodetector 102 that includes the circular optical grating 106.

FIG. 6C is a cross-sectional view through a portion of the trench 120 along the line 6C shown in FIG. 6A, according to one embodiment. The line 6C passes through multiple dielectric fins 108 and multiple photosensitive fins 110. Each photosensitive fin 110 is positioned between two dielectric fins 108. Each dielectric fin 108 is positioned between two photosensitive fins 110.

Figure 7:
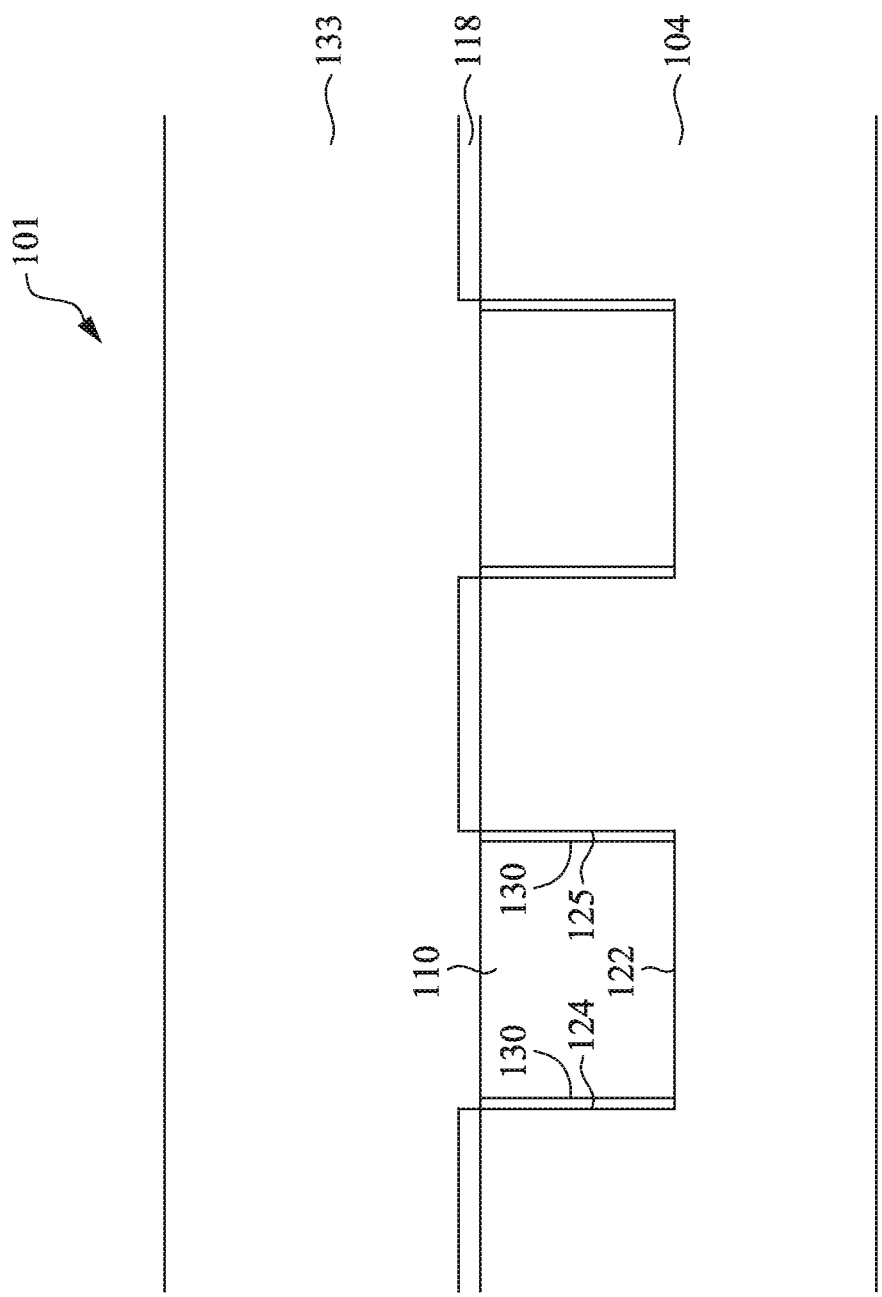
FIG. 7 is a cross-sectional diagram of an integrated circuit at an intermediate stage of fabrication, according to one embodiment.

FIG. 7 is a cross-sectional view of the integrated circuit 101 at an intermediate stage of processing, according to one embodiment. In FIG. 7, a layer of dielectric material 133 has been deposited over the circular optical grating 106 and over the layer of dielectric material 118. The layer of dielectric material 133 can include one or more of silicon oxide, silicon nitride, or other dielectric materials. Accordingly, the layer of dielectric material 133 can be another layer of dielectric material.

In one embodiment, the layer of dielectric material 133 is a same material as the dielectric fins 108 and the dielectric sidewall coating 130. Alternatively, the layer of dielectric material 133 can be a different material than the dielectric fins 108 and the dielectric sidewall coating 130. The layer of dielectric material 133 is selected to be transparent to light 114 that will be incident on the circular optical grating 106. The layer of dielectric material can have an index of refraction that is the same as or different than the index of refraction of the photosensitive fins.

Figure 8A:
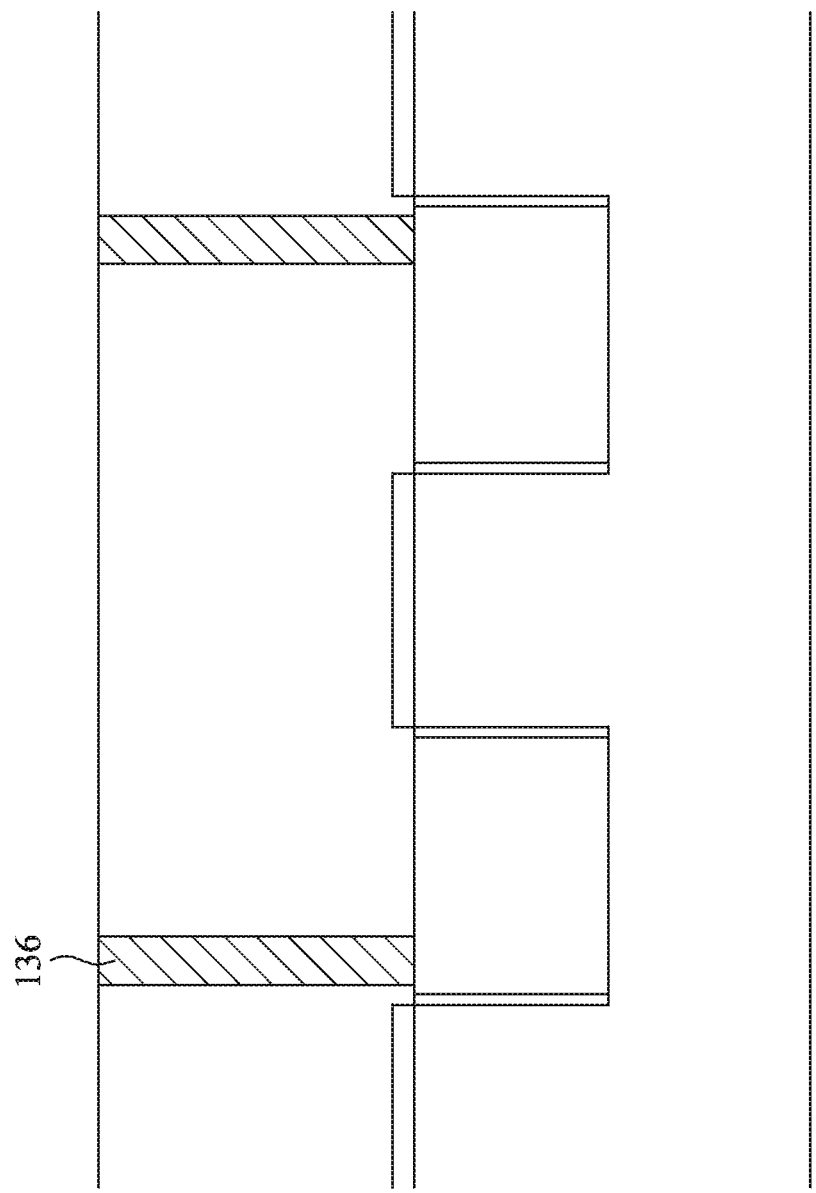
FIG. 8A is a cross-sectional diagram of an integrated circuit at an intermediate stage of fabrication, according to one embodiment.
Figure 8B:
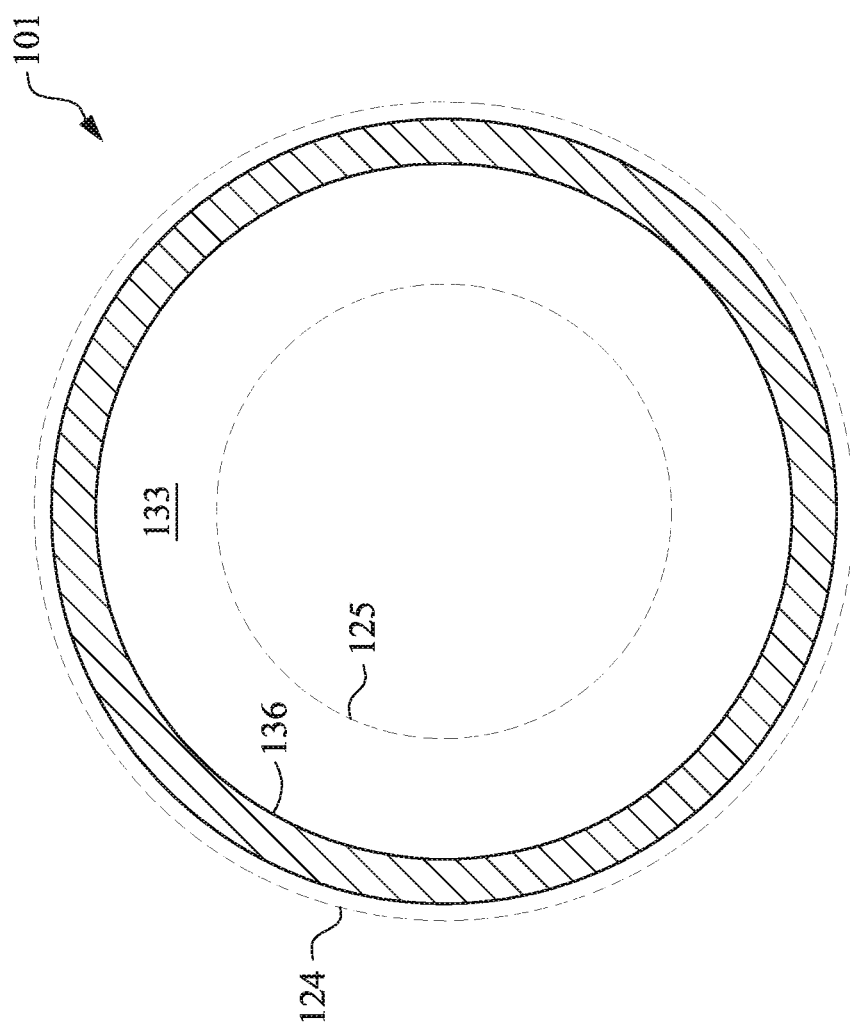
FIG. 8B is a top view of the integrated circuit of FIG. 8A, according to one embodiment.

FIG. 8A is a cross-sectional view of the integrated circuit 101 at an intermediate stage of processing, according to one embodiment. FIG. 8B is a top view of the integrated circuit 101 of FIG. 8A, according to one embodiment. In FIGS. 8A and 8B, opening has been etched in the layer of dielectric material 133 and an electrode 136 have been formed in the opening.

The electrode 136 includes one or more conductive materials such as metal or polysilicon. The electrode 136 is annular in that it contacts each of the photosensitive fins 110. The electrode 136 can apply biasing voltages to the photosensitive fins 110 and/or can read signals from the photosensitive fins 110. One or more electrodes can also contact the semiconductor substrate 104 to enable application of biasing voltages between the semiconductor substrate 104 and the photosensitive fins 110. An electrode 136 contacting the photosensitive fins 110 can have other shapes, positions, and configurations without departing from the scope of the present disclosure.

Figure 9:
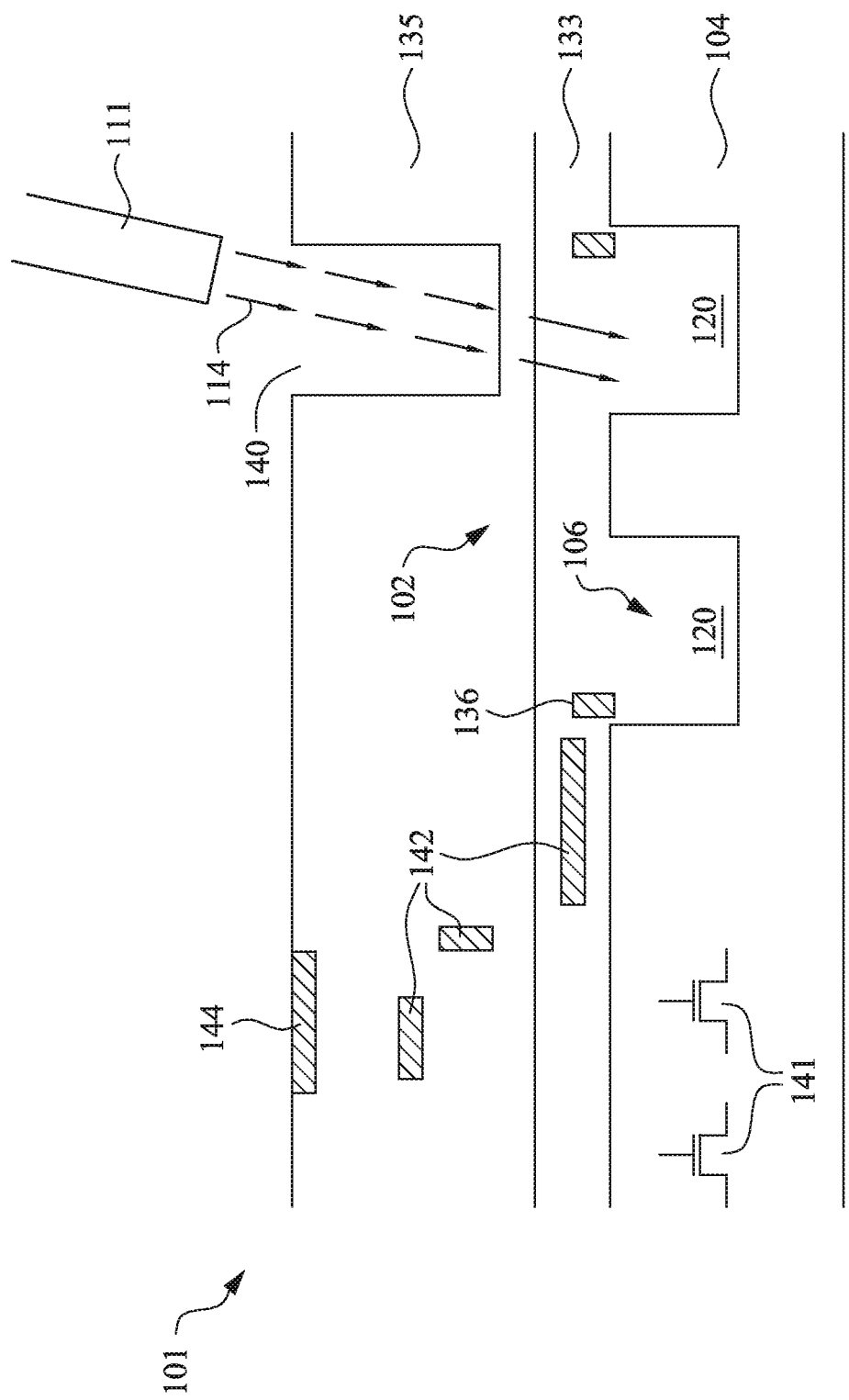
FIG. 9 is a cross-sectional diagram of an integrated circuit, according to one embodiment.

FIG. 9 is a cross-section of an integrated circuit 101, according to one embodiment. FIG. 9 illustrates a photodetector 102 including a circular optical grating 106 positioned on a semiconductor substrate 104. The dielectric fins 108 and photosensitive fins 110 of the circular optical grating 106 are not shown in FIG. 9, for simplicity. A plurality of transistors 141 are formed in conjunction with the semiconductor substrate 104.

A dielectric stack 135 is formed on the layer of dielectric material 133. The integrated circuit 101 includes metal interconnects 142 positioned throughout the dielectric stack 144. The integrated circuit 101 includes one or more external connection pads 144. The metal interconnects 142 enable connection between transistors 141, the photodetector 102, connection pads 144, and any other circuit components that may be included in the integrated circuit 101. The transistors 141 may include the control circuitry 112 described in relation to FIG. 1. The metal interconnects 142 enable application of bias voltages to the photodetector 102, as well as the reading of signals from the photodetector 102.

An opening 140 is formed in the dielectric stack 133. A light source 111, such as a fiberoptic cable, outputs light 114 into the opening 140. The light 114 travels to the circular optical grating 106 and is redirected to travel around the circular optical grating 106 until the light 114 is absorbed by one of the photosensitive fins 110.

The integrated circuit 101 may be a photonic integrated circuit that transforms optical signals from the light source 111 to electrical signals. A logic integrated circuit may be coupled to the integrated circuit 101 via the pads 144. The logic integrated circuit may receive the electrical signals generated by the photonic integrated circuit 101 and may process the electrical signals to extract data therefrom. In this case, the photonic integrated circuit 101 may or may not include transistors 141. The logic integrated circuit can include transistors 141 for processing the electrical signals.

In one embodiment, the circular optical grating 106 utilizes well understood principles of optical grating couplers to redirect the trajectory of nearly vertical incident light. Traditional optical grating couples are not circular. Typically, traditional optical grating couplers focus light into a waveguide that guides the light to a photosensitive material that may absorb the light. However, if the photosensitive material does not absorb the light on a first pass, the light may exit the photosensitive material undetected. Thus, traditional photodetectors that use traditional optical grating couplers are inefficient because a large amount of incident light is never absorbed by the photosensitive material. The circular optical grating 106 of FIG. 1-9 provides for a photodetector with enhanced sensitivity because the light 114 loops around the circular optical grating until it is absorbed by one of the photosensitive fins 110.

Further details regarding optical grating couplers can be found in "Grating Couplers for Coupling between Optical Fibers and Nanophotonic Waveguides", Japanese Journal of Applied Physics Vol. 45, No. 8A, 2006, pp. 6071-6077, incorporated herein by reference.

Figure 10:
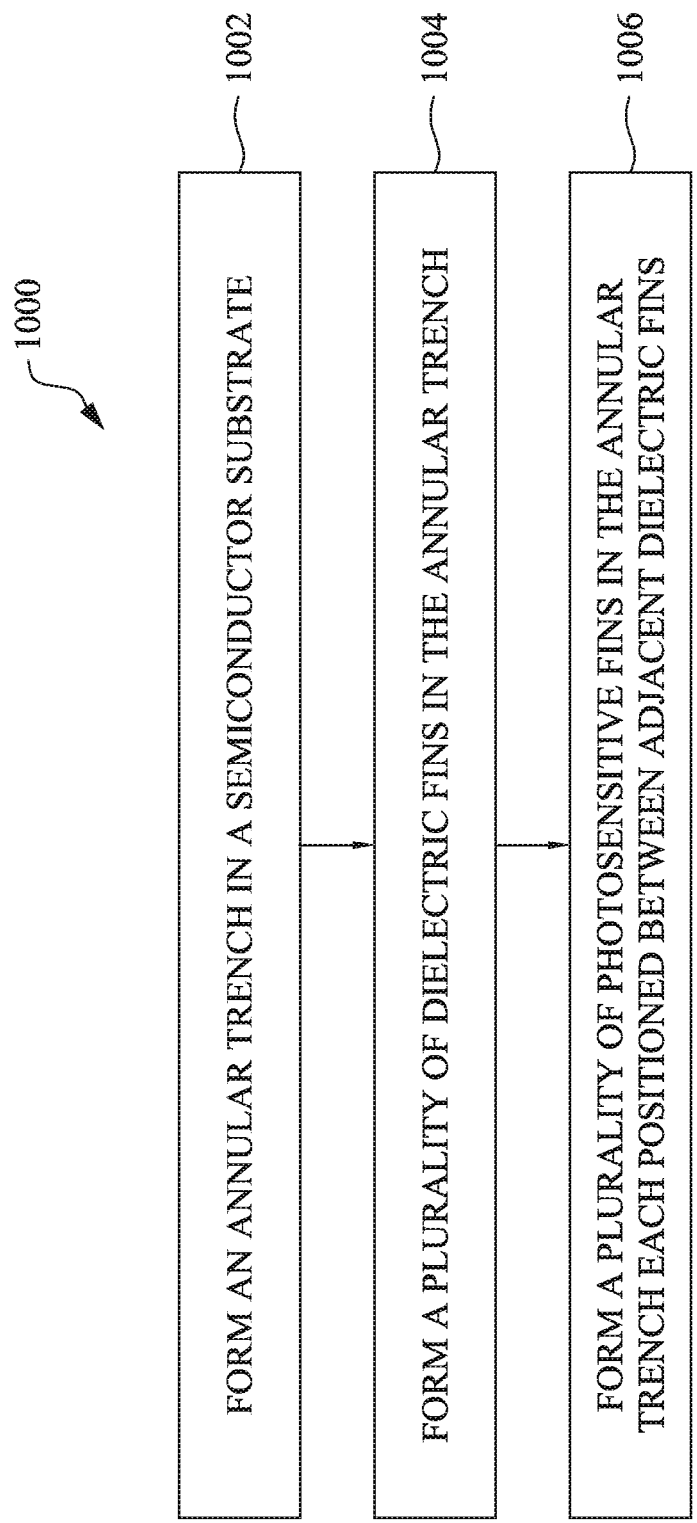
FIG. 10 is a flow diagram of a method for forming an integrated circuit, according to one embodiment.

FIG. 10 is a flow diagram of a method 1000 for forming an integrated circuit, according to one embodiment. At 1002 the method 1000 includes forming an annular trench in a semiconductor substrate. One example of a semiconductor substrate is the semiconductor substrate 104 of FIG. 6A-6C. One example of an annular trench is the annular trench 120 of FIGS. 6A-6C. At 1004 the method 1000 includes forming a plurality of dielectric fins in the annular trench. One example of dielectric fins are the dielectric fins 108 of FIGS. 6B, 6C. At 1006 the method 1000 includes forming a plurality of photosensitive fins (110) in the annular trench each positioned between adjacent dielectric fins. One example of photosensitive fins are the photosensitive fins 110 of FIGS. 6A-6C.

In one embodiment, an integrated circuit includes a semiconductor substrate, an annular trench in the semiconductor substrate, and a plurality of dielectric fins in the annular trench. The integrated circuit includes a plurality of photosensitive fins positioned in the annular trench each between two adjacent dielectric fins. The plurality of dielectric fins and photosensitive fins are configured as a circular optical grating configured to direct incident light around the annular trench.

In one embodiment, a photodetector includes a semiconductor substrate and a circular optical grating formed in the semiconductor substrate. The circular optical grating including a plurality of dielectric fins and a plurality of photosensitive fins each positioned between adjacent dielectric fins.

In one embodiment, a method includes forming an annular trench in a semiconductor substrate and forming a plurality of dielectric fins in the annular trench. The method includes forming a plurality of photosensitive fins in the annular trench each positioned between adjacent dielectric fins.

The various embodiments described above can be combined to provide further embodiments. Aspects of the embodiments can be modified, if necessary, to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An integrated circuit comprising:
   a semiconductor substrate;
   an annular trench in the semiconductor substrate;
   a plurality of dielectric fins in the annular trench; and
   a plurality of photosensitive fins positioned in the annular trench each between two adjacent dielectric fins, wherein the plurality of dielectric fins and photosensitive fins are configured as a circular optical grating configured to direct incident light around the annular trench.

2. The integrated circuit of claim 1, wherein the circular optical grating and the semiconductor substrate are configured as a photodetector configured to detect light incident on the circular optical grating.

3. The integrated circuit of claim 2, wherein the photodetector detects light by absorbing light in the photosensitive fins.

4. The integrated circuit of claim 3, wherein the photosensitive fins and the semiconductor substrate are configured as a photodiode.

5. The integrated circuit of claim 1, wherein the photosensitive fins include germanium.

6. The integrated circuit of claim 5, wherein the semiconductor substrate includes silicon.

7. The integrated circuit of claim 1, wherein the dielectric fins include silicon oxide.

8. The integrated circuit of claim 1, wherein the annular trench includes:
   an inner sidewall defining an inner lateral bound of the annular trench;
   an outer sidewall defining an outer lateral bound of the annular trench; and
   a sidewall dielectric coating covering the inner sidewall and the outer sidewall.

9. The integrated circuit of claim 1, further comprising an annular electrode contacting the photosensitive fins.

10. The integrated circuit of claim 1, wherein the annular trench has a substantially rectangular cross-section.

11. The integrated circuit of claim 1, wherein the photosensitive fins and the dielectric fins are curved.

12. The integrated circuit of claim 11, wherein the photosensitive fins and the dielectric fins act as lenses that direct light around the annular trench.

13. A photodetector, comprising:
    a semiconductor substrate; and
    a circular optical grating formed in the semiconductor substrate, the circular optical grating including:
        a plurality of dielectric fins; and
        a plurality of photosensitive fins each positioned between adjacent dielectric fins.

14. The photodetector of claim 13, further comprising an annular trench formed in the semiconductor substrate, wherein the plurality of dielectric fins and photosensitive fins are positioned in the annular trench.

15. The photodetector of claim 14, wherein the circular optical grating is configured to direct light around the annular trench.

16. A method, comprising:
    forming an annular trench in a semiconductor substrate;
    forming a plurality of dielectric fins in the annular trench; and
    forming a plurality of photosensitive fins in the annular trench each positioned between adjacent dielectric fins.

17. The method of claim 16, further comprising forming the photosensitive fins by an epitaxial growth from a bottom surface of the annular trench.

18. The method of claim 16, wherein the photosensitive fins are monocrystalline semiconductor fins.

19. The method of claim 16, further comprising forming an electrode in contact with the photosensitive fins.

20. The method of claim 16, further comprising forming an aperture in an integrated circuit for receiving light into the annular trench.

* * * * *